(12) United States Patent
Kuhn

(10) Patent No.: US 6,438,825 B1
(45) Date of Patent: *Aug. 27, 2002

(54) METHOD TO PREVENT INTRUSIONS INTO ELECTRONIC CIRCUITRY

(75) Inventor: Harry A Kuhn, Phoenix, AZ (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/008,968

(22) Filed: Jan. 20, 1998

Related U.S. Application Data

(63) Continuation of application No. 08/917,988, filed on Aug. 25, 1997, which is a continuation of application No. 08/412,159, filed on Mar. 28, 1995, now abandoned.

(51) Int. Cl.[7] .................................................. H05K 3/36
(52) U.S. Cl. .............................. 29/830; 29/831; 29/832; 29/855; 174/52.4
(58) Field of Search ................................ 174/52.1, 52.4; 29/830, 855, 828, 829, 831, 832; 380/3, 4; 357/71, 72, 80, 81

(56) References Cited

U.S. PATENT DOCUMENTS

| | | | | |
|---|---|---|---|---|
| 4,477,134 A | * | 10/1984 | Wright | 339/17 F |
| 4,860,351 A | * | 8/1989 | Weingart | 380/3 X |
| 5,027,397 A | * | 6/1991 | Double et al. | 380/4 X |
| 5,045,921 A | * | 9/1991 | Lin et al. | 357/74 |
| 5,166,772 A | | 11/1992 | Soldner et al. | |
| 5,233,505 A | | 8/1993 | Chang et al. | |
| 5,336,931 A | | 8/1994 | Juskey et al. | |
| 5,353,350 A | | 10/1994 | Unsworth et al. | |
| 5,360,941 A | | 11/1994 | Roes | |
| 5,386,342 A | * | 1/1995 | Rostoker et al. | 361/749 |
| 5,444,387 A | | 8/1995 | Van Loan et al. | |
| 5,478,006 A | | 12/1995 | Taguchi | |
| 5,491,612 A | | 2/1996 | Nicewarner, Jr. | |
| 5,499,161 A | | 3/1996 | Hosseinzadeh et al. | |
| 5,751,553 A | * | 5/1998 | Clayton | 361/749 |
| 5,761,054 A | * | 6/1998 | Kuhn | 361/818 X |

FOREIGN PATENT DOCUMENTS

| | | |
|---|---|---|
| EP | 0 268 142 A2 | 5/1988 |
| EP | 0 417 447 A2 | 3/1991 |

* cited by examiner

Primary Examiner—Jessica Harrison
Assistant Examiner—Binh-An D. Nguyen
(74) Attorney, Agent, or Firm—Blakely, Sokoloff, Taylor & Zafman LLP

(57) ABSTRACT

An integrated circuit package which has a flexible circuit that covers an integrated circuit. The flexible circuit contains a conductive line which prevents a probe from accessing the integrated circuit. The conductive line of the flexible circuit can be attached to the power lines, synchronization line, memory erase line, or any other line that will disable, erase or otherwise prevent access to the integrated circuit if the flexible circuit conductive line is broken. The integrated circuit can be mounted to a printed circuit board. The printed circuit board, integrated circuit and flexible circuit can all be enclosed within the package.

24 Claims, 3 Drawing Sheets

METHOD TO PREVENT INTRUSIONS INTO ELECTRONIC CIRCUITRY

CROSS-REFERENCE TO RELATED PATENT APPLICATIONS

This application is a continuation of application Ser. No. 08/917,988, filed Aug. 25, 1997, which is a continuation of application Ser. No. 08/412,159, filed Mar. 28, 1995, now abandoned.

BACKGROUND OF THE INVENTION

1. Field of the Invention

The present invention relates to an integrated circuit package which prevents the interrogation of an integrated circuit.

2. Description of the Related Art

Integrated circuits are typically housed within a plastic or ceramic package that is soldered to a printed circuit board. The integrated circuit may contain information such as microcode that is proprietary to the producer of the chip. The downloading of such information can be valuable to a competitor that may want to duplicate the circuit. Additionally, the integrated circuit may contain information proprietary to the end user, such as credit and banking information.

The information on a integrated circuit can be accessed by exposing the circuit die to a probe(s). The die can be exposed to the probe by simply removing the package lid or etching away the package material. It would be desirable to provide an integrated circuit package that would prevent the interrogation of an integrated circuit by an external probe.

SUMMARY OF THE INTENTION

The present invention is an integrated circuit package which has a flexible circuit that covers an integrated circuit. The flexible circuit contains a conductive line, which prevents a probe from accessing the integrated circuit. The conductive line of the flexible circuit can be attached to the power lines, synchronization line, memory erase line, or any other line that will disable, erase or otherwise prevent access to the integrated circuit if the flexible circuit conductive line is broken.

BRIEF DESCRIPTION OF THE DRAWINGS

The objects and advantages of the present invention will become more readily apparent to those ordinarily skilled in the art after reviewing the following detailed description and accompanying drawings, wherein.

Figure 2:
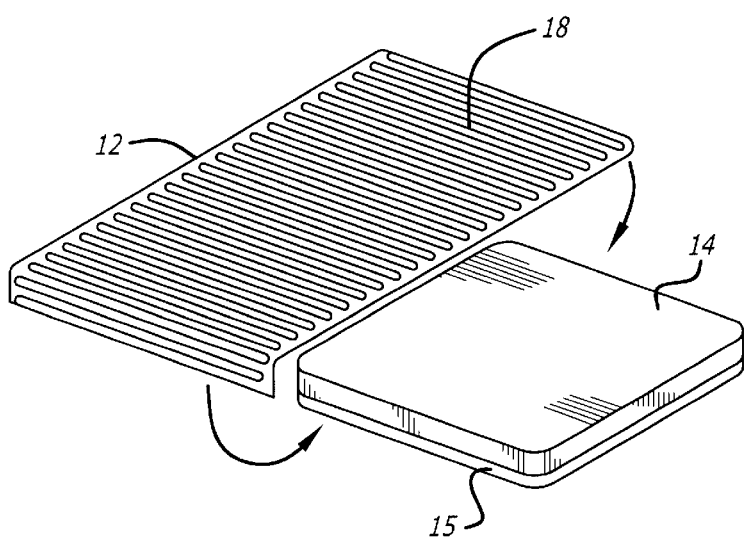
Figure 3:
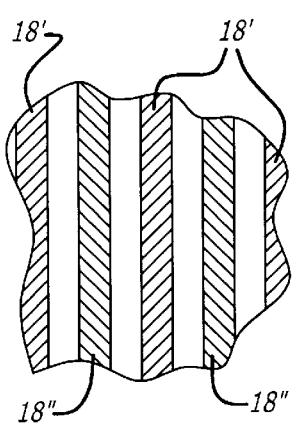
Figure 4:
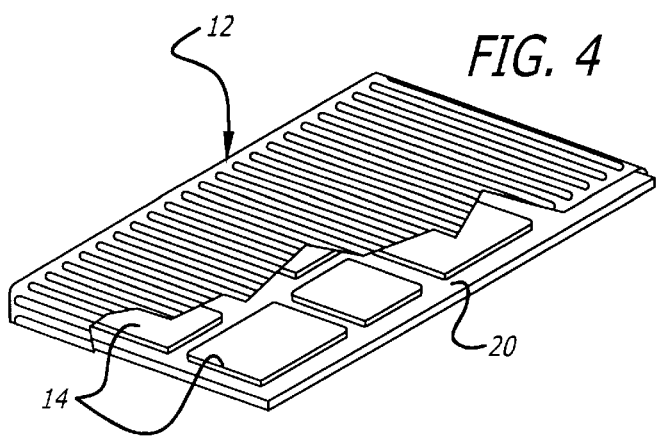
Figure 5:
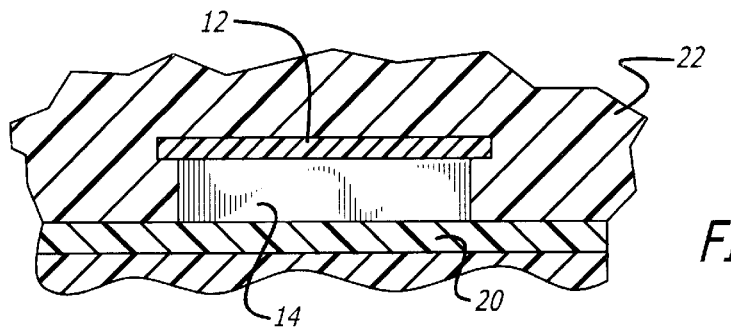
Figure 6:
Figure 7A:
Figure 7B:
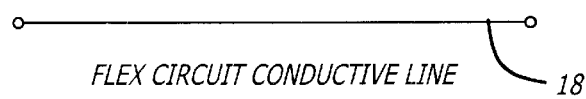
Figure 7C:
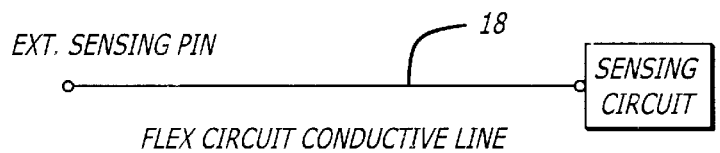

a FIG. 2 is an exploded view of the integrated circuit package;

FIG. 3 is an enlarged view of a flexible circuit that is wrapped around an integrated circuit;

FIG. 4 is a perspective view of an integrated circuit and flexible circuit attached to a printed circuit board;

FIG. 5 is a cross-sectional view showing the integrated circuit, flexible circuit and printed circuit board within a package;

FIG. 6 is a schematic of a flexible circuit line that functions as a fuse for an integrated circuit;

FIGS. 7a–c are schematics showing the flexible circuit line connected to a sync line, a memory erase line and a sensing line of an integrated circuit.

Figure 8:
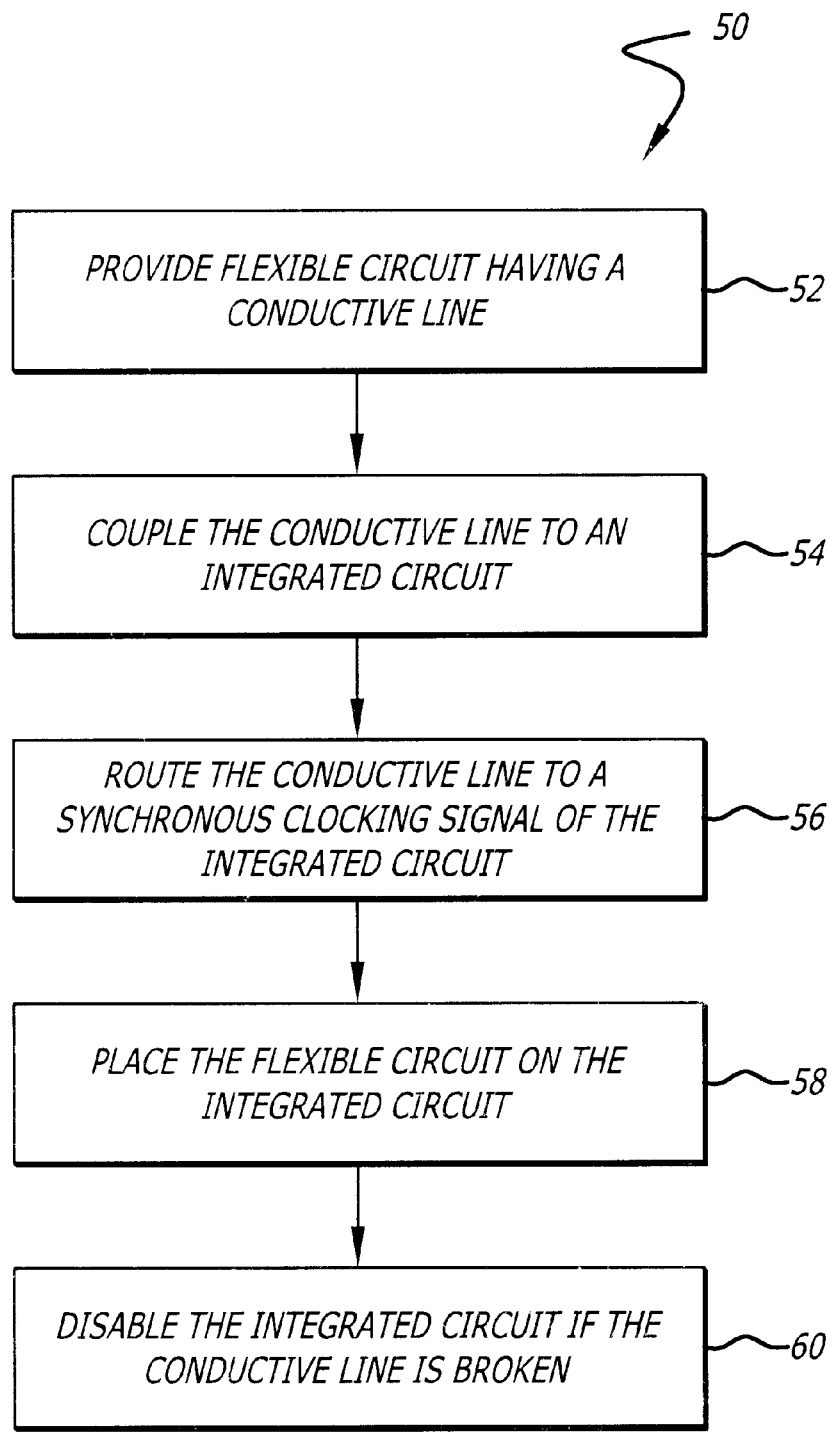

FIG. 8 is a flow chart illustrating a method to prevent intrusions into the integrated circuit assembly.

DETAILED DESCRIPTION OF THE INVENTION

Figure 1:
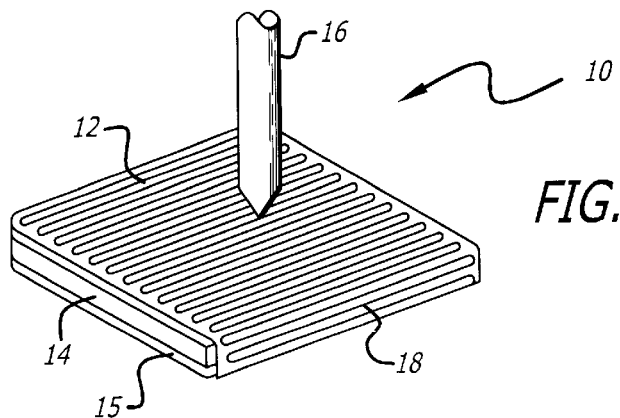
FIG. 1 is a perspective view of an integrated circuit assembly of the present invention.

Referring to the drawings more particularly by reference umbers, FIGS. 1 and 2 show an integrated circuit assembly 10 of the present invention. The assembly 10 includes a flexible circuit 12 that is wrapped around an integrated circuit die 14 that is mounted to a substrate 15. The substrate 15 may have a plurality of contacts (not shown) that allow the substrate 15 and integrated circuit 14 to be connected to an external device. The integrated circuit 14 typically has a plurality of terminals and bonding pads located throughout the circuit. The signals and corresponding information within the integrated circuit 14 can be sensed and downloaded by an external probe 16 that is placed into contact with the pads. The flexible circuit 12 prevents the probe 16 from coming into contact with the terminals, thereby precluding access to the information within the integrated circuit 14. The integrated circuit 14 may be covered with an encapsulant (not shown) located between the outer surface of the circuit 14 and the undersurface of the flexible circuit 12. The encapsulant may further protect the surface of the circuit 14.

The flexible circuit 12 can be constructed to have a conductive line 18 routed throughout the circuit 12. The conductive line 18 can be an etched trace that is attached to an outer layer of dielectric polyimide material. The conductive line 18 can be routed in a serpentine manner to form a continuous single trace across the flexible circuit 12. The conductive line 18 may be spaced so that any attempt to place a probe onto the integrated circuit 14 will result in the probe making electrical contact with the conductive trace, thereby shielding access to the terminals and pads of the circuit 14.

As shown in FIG. 3, to increase the spacing of the conductive line 18 and decrease the cost of producing the flexible circuit 12, the flexible circuit 12 may have two layers wherein the conductive line 18' of the first layer are located within the spaces between the conductive traces 18" of the second layer. The flexible circuit 12 may be bonded to the integrated circuit 14 with an adhesive that stronger than the material of the flexible circuit 12, or the integrated circuit 14, so that any attempt to unwrap the flexible circuit 12 from the die 14 will result in the destruction of the integrated circuit 14, or the separation of the polyimide and the conductive line 18 so that the conductive line 18 remains attached to the die 14.

As shown in FIG. 4, one or more integrated circuits 14 can be mounted to a printed circuit board 20. The printed circuit board 20 may contain wire routing to interconnect the integrated circuits 14. The flexible circuit 12 can be wrapped around the integrated circuits 14 to protect the same. Additionally, the flexible circuit 12 can also be wrapped around the printed circuit board 20 to prevent access to the routing of the board 20. As an alternate embodiment, a portion of the flexible circuit 12 may be reinforced with a rigid substrate and mounted to the integrated circuits 14. The flexible circuit 12 may have additional conductive line to provide routing between the integrated circuits 14.

As shown in FIG. 5, the integrated circuits 14, flexible circuit 12 and printed circuit board 20 may be enclosed within a package 22. The package 22 may be formed by a plastic injection molding process. The integrated circuit 14 may be connected to external package leads (not shown) by vias, a lead frame, or other package interconnect known in the art. The flexible circuit 12 prevents access to the integrated circuits even if the circuits are removed from, or exposed within, the package.

FIG. 6 shows the conductive line 18 of the flexible circuit 12 connected to a pair of power pins of the integrated circuit 14. The conductive line 18 can function as a fuse, so that if the line is opened, power cannot be provided to the integrated circuit 14. Therefore if an intruder attempts to access the die 14 by cutting through the flexible circuit 12, the severing of the conductive line 18 will create an open circuit that will prevent operation of the integrated circuit 14.

As shown in FIG. 7, the conductive line 18 may also be connected to other pins of the integrated circuit 14 that will render the integrated circuit inoperable or in accessible if the conductive line 18 is broken. For example, the conductive line 18 of the flexible circuit 12 may provide the synchronization (sync) clock signal to the integrated circuit. The clock synchronization signal may be an unknown value, so that when the conductive line is broken, an intruder may not provide a valid sync signal to the integrated circuit to operate the same. If the integrated circuit 14 is a memory device, the conductive line 18 can be connected to the erase pin, so that an open line 18 will erase the contents of the memory device. As another alternative, the conductive line 18 may be connected to a sensing circuit which senses when the line 18 is broken or is being probed and disables the integrated circuit 14, accordingly. The flexible circuit 12 therefore prevents accordingly. The flexible circuit 12 therefore prevents access to the integrated circuit die and/or the information contained within the integrated circuit.

FIG. 8 is a now chart 50 illustrating a method to prevent intrusions into the integrated circuit assembly 10 according to one embodiment of the invention. The flexible circuit 12 is provided with the conductive line 18 (Block 52), and the conductive line 18 is coupled to the integrated circuit die 14 (Block 54). The conductive line 18 is routed to a synchronous clocking signal of the integrated circuit die 14 (Block 56). Next, the flexible circuit 12 is placed on the integrated circuit die 14 (Block 58). The integrated circuit assembly 10 is disabled if the conductive line 18 is broken (Block 60).

While certain exemplary embodiments have been described and shown in the accompanying drawings. it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method comprising:
   providing a flexible circuit including a conductive line;
   coupling the conductive line to a protected integrated circuit;
   routing the conductive line to a synchronous clocking signal of the protected integrated circuit only, the synchronous clocking signal providing a valid synchronous signal to the protected integrated circuit;
   placing the flexible circuit on the protected integrated circuit to cover at least a top surface of the protected integrated circuit; and
   disabling the protected integrated circuit by preventing the protected integrated circuit from receiving the synchronous clocking signal if the conductive line of the flexible circuit is broken.

2. The method as recited in claim 1, wherein the protected integrated circuit includes a plurality of terminals and bonding pads.

3. The method as recited in claim 2, wherein the conductive line is coupled at least one terminal of the protected integrated circuit.

4. The method as recited in claim 2, wherein the conductive line is coupled to at least one pad of the protected integrated circuit.

5. The method as recited in claim 1, wherein the protected integrated circuit further comprises a sensing circuit coupled to the conductive line.

6. The method as recited in claim 5 further comprising:
   disabling the protected integrated circuit in response to the sensing circuit detecting that the protected integrated circuit is being probed in response to the conductive line if the flexible circuit is broken.

7. The method as recited in claim 1, wherein the flexible circuit further comprises:
   a first layer including the conductive line; and
   a second layer including an additional conductive line.

8. The method as recited in claim 7, wherein the conductive line of the first layer is disposed between spaces of the additional conductive line of the second layer.

9. The method as recited in claim 1, wherein the covering of the protected integrated circuit further includes placing the protected integrated circuit and the flexible circuit within an integrated circuit package.

10. A method comprising:
    placing a flexible circuit on a protected integrated circuit to cover a surface of the protected integrated circuit, the flexible circuit includes a conductive line;
    coupling the conductive line to the protected integrated circuit;
    routing the conductive line to a synchronous clocking signal of the protected integrated circuit only, the synchronous clocking signal providing a valid synchronous signal to the protected integrated circuit; and
    disabling the protected integrated circuit if the conductive line of the flexible circuit is broken by preventing the protected integrated circuit from receiving the synchronous clocking signal.

11. The method as recited in claim 10, wherein the coupling of the conductive line includes coupling the conductive line to an erase pin of the protected integrated circuit.

12. The method as recited in claim 11, wherein the disabling of the protected integrated circuit includes erasing data stored within the protected integrated circuit if the conductive line of the flexible circuit is broken.

13. The method as recited in claim 12, wherein prior to erasing the data, the method further comprises placing the protected integrated circuit and the flexible circuit within an integrated circuit package.

14. The method as recited in claim 10, wherein prior to routing the synchronous clocking signal, the method further comprises placing the protected integrated circuit and the flexible circuit within an integrated circuit package.

15. The method as recited in claim 10, wherein the flexible circuit further comprises:
    a first layer including the conductive line; and
    a second layer including an additional conductive line.

16. The method as recited in claim 15, wherein the conductive line of the first layer is disposed between spaces of the additional conductive line of the second layer.

17. A method comprising:
    coupling a flexible circuit to a protected integrated circuit, the flexible circuit having a conductive line;

providing a clocking signal to the protected integrated circuit via the conductive line, the clocking signal providing a valid signal to the protected integrated circuit;

disposing the flexible circuit on the protected integrated circuit to cover at least a top surface of the protected integrated circuit; and disabling the protected integrated circuit by preventing the protected integrated circuit from receiving the clocking signal if the conductive line of the flexible circuit is broken.

18. The method as recited in claim 17, wherein the integrated circuit includes a plurality of terminals and bonding pads.

19. The method as recited in claim 17, wherein the conductive line is coupled to at least one terminal of the integrated circuit.

20. The method as recited in claim 17, wherein the conductive line is attached to a dielectric polyimide material.

21. The method as recited in claim 17, wherein the conductive line is etched.

22. The method as recited in claim 17, wherein the flexible circuit is bonded to the protected integrated circuit with an adhesive.

23. The method as recited in claim 17, wherein the flexible circuit is wrapped around the protected integrated circuit.

24. The method as recited in claim 17, wherein the flexible circuit and protected integrated circuit are enclosed within a package.

* * * * *

UNITED STATES PATENT AND TRADEMARK OFFICE
CERTIFICATE OF CORRECTION

PATENT NO.      : 6,438,825 B1
DATED           : August 27, 2002
INVENTOR(S)     : Kuhn It is certified that error appears in the above-identified patent and that said Letters Patent is hereby corrected as shown below:

Column 2,
Line 42, delete "traces", insert -- line --.

Signed and Sealed this

Seventeenth Day of December, 2002

JAMES E. ROGAN
*Director of the United States Patent and Trademark Office*